United States Patent
Cho

[11] Patent Number: 6,117,724
[45] Date of Patent: Sep. 12, 2000

[54] DRAM CELL AND METHOD OF FABRICATING THE SAME

[75] Inventor: Won Ju Cho, Chungcheongbuk-do, Rep. of Korea

[73] Assignee: LG Semicon Co., Ltd., Chungcheongbuk-do, Rep. of Korea

[21] Appl. No.: 09/410,752

[22] Filed: Oct. 1, 1999

Related U.S. Application Data

[62] Division of application No. 08/883,171, Jun. 26, 1997, Pat. No. 5,994,729.

[30] Foreign Application Priority Data

Oct. 22, 1996 [KR] Rep. of Korea .................. 96-47451

[51] Int. Cl.$^7$ ............................................. H01L 21/8242
[52] U.S. Cl. .................... 438/239; 438/156; 438/238; 438/268; 438/269; 438/284
[58] Field of Search ..................... 438/156, 212, 438/209, 210, 238, 239, 268, 269, 284

[56] References Cited

U.S. PATENT DOCUMENTS

| | | |
|---|---|---|
| 4,742,018 | 5/1988 | Kimura et al. . |
| 5,281,837 | 1/1994 | Kohyama .................. 257/306 |
| 5,497,017 | 3/1996 | Gonazles .................. 257/306 |
| 5,561,308 | 10/1996 | Kamata et al. .......... 257/306 |
| 5,684,316 | 11/1997 | Lee .......................... 257/306 |
| 5,696,395 | 12/1997 | Tseng ...................... 257/306 |
| 5,707,885 | 1/1998 | Lim . |
| 5,828,094 | 10/1998 | Lee .......................... 257/306 |

*Primary Examiner*—Trung Dang

[57] ABSTRACT

A method of fabricating a DRAM cell and the DRAM cell include a substrate, and a bit line formed in a first direction on the substrate. A channel region is then formed on a portion of the bit line. The channel region has a lateral surface extending vertically from the bit line. A first insulating layer is formed over the substrate, excluding the channel region, and is formed on at least a portion of the lateral surface of the channel region. A gate electrode is formed on a portion of the first insulating layer, which is on the portion of the lateral surface of the channel region, and a word line, connected to the gate electrode, is formed in a second direction on the first insulating layer. A second insulating layer is then formed over a portion of the substrate. The second insulating layer has a contact hole which exposes the channel region. Next, a capacitor is formed on a portion of the second insulating layer and on the channel region via the contact hole.

15 Claims, 17 Drawing Sheets

DRAM CELL AND METHOD OF FABRICATING THE SAME

This application is a divisional of application Ser. No. 08/883,171, filed on Jun. 26, 1997, now U.S. Pat. No. 5,994,729 the entire contents of which are hereby incorporated by reference.

BACKGROUND OF THE INVENTION

1. Field of the Invention

The present invention relates to a DRAM cell and, more particularly, to a DRAM cell and a method of fabricating the same, in which the DRAM cell is formed having a vertical structure in order to decrease the number of fabrication steps while increasing packing density.

2. Discussion of Related Art

Generally, a DRAM cell having a horizontal structure consists of one bit line, one word line, one access transistor and one storage capacitor. The gate of the access transistor is connected to the word line, and its drain is connected to the bit line. Various structures of DRAM cell arrays have been proposed in order to increase the packing density of the DRAM.

A conventional DRAM cell will be explained below with reference to FIG. 1. FIG. 1 is a cross-sectional view of the conventional DRAM cell structure. As shown in FIG. 1, the conventional DRAM cell is constructed in such a manner that a p-type well 11 is formed in an n-type semiconductor substrate 10, a gate electrode 13 is formed on an active region of p-type well 11 and is insulated from the active region by a gate oxide layer 12.

The conventional DRAM cell further includes a gate cap oxide layer 14, sidewall oxide layer 15, drain and source regions 16a and 16b formed in a portion of p-type well 11 placed on both sides of gate electrode 13, and a first interlevel insulating layer 17 formed on the overall surface of the substrate including gate electrode 13.

The first interlevel insulating layer 17 has a first contact hole exposing the drain region 16a. Furthermore, a bit line 19 for transmitting data is formed on first interlevel insulating layer 17, and is electrically connected to drain region 16a via the contact hole. Second and third interlevel insulating layers 21 and 22 are formed over the substrate 10. Second and third interlevel insulating layers 21 and 22 have a second contact hole formed therein exposing source region 16b. Moreover, a capacitor storage electrode 23 is formed on third interlevel insulating layer 22 and is electrically connected to source region 16b through the second contact hole. The capacitor storage electrode 23 has a protrusion at both its edges. A dielectric layer 24 is formed on the capacitor storage electrode 23, and a capacitor plate electrode 25 is formed on dielectric layer 24. Also, as shown in FIG. 1, sidewall insulating layers 18a and 18b are formed on the inner sidewall of the first and second contact holes, respectively, and the bit line 19 has a double structure with a conductive layer 20 laminated thereon.

In the aforementioned conventional DRAM cell, the source region 16b, the drain region 16a, and channel region therebetween are formed horizontally, and the gate oxide layer 12 and gate electrode 13 are formed on the channel region. The conventional DRAM cell has the following problems. First, when the conventional DRAM cell structure is applied to a highly integrated device, the short channel effect is increased since the source region, drain region and channel region are formed horizontally. Also, the capacitance is reduced if the size of the DRAM cell is decreased.

Secondly, the bit line and capacitor are sequentially formed to contact the source and drain regions of the transistor, respectively. This makes the photolithography processes complicated. Also, it is difficult to secure a margin of error during the photolithography processes.

SUMMARY OF THE INVENTION

Accordingly, the present invention is directed to a DRAM cell and a method of fabricating the same that substantially obviates one or more of the problems due to limitations and disadvantages of the related art.

An object of the present invention is to provide a vertical-structure DRAM cell suitable for a highly integrated device.

These other objects are achieved by providing a DRAM cell, comprising: a substrate; a bit line formed in a first direction on said substrate; a channel region formed on a portion of said bit line, said channel region having a lateral surface extending vertically from said bit line; a first insulating layer formed over said substrate, excluding said channel region, and formed on at least a portion of said lateral surface of said channel region; a gate electrode formed on a portion of said first insulating layer which is on said portion of said lateral surface of said channel region; a word line connected to said gate electrode and formed in a second direction on said first insulating layer; a second insulating layer formed over a portion of said substrate and having a contact hole which exposes said channel region; and a capacitor formed on a portion of said second insulating layer and on said channel region via said contact hole.

These and other objects are also achieved by providing a method of fabricating a DRAM cell, comprising: (a) providing a substrate; (b) forming a bit line in a first direction on said substrate; (c) forming a channel region on a portion of said bit line, said channel region having a lateral surface extending vertically from said bit line; (d) forming a first insulating layer over said substrate, excluding said channel region, and on at least a portion of said lateral surface of said channel region; (e) forming a first conductive layer in a second direction on said first insulating layer to serve as a word line, and on a portion of said first insulating layer, which is on said portion of said lateral surface of said channel region, to serve as a gate electrode; (f) forming a second insulating layer over a portion of said substrate such that said second insulating layer covers said channel region; (g) forming a contact hole in said second insulating layer which exposes said channel region; and (h) forming a capacitor on a portion of said second insulating layer and on said channel region via said contact hole.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings:

DETAILED DESCRIPTION OF PREFERRED EMBODIMENT

Reference will now be made in detail to the preferred embodiments of the present invention, examples of which are illustrated in the accompanying drawings.

Figure 1:
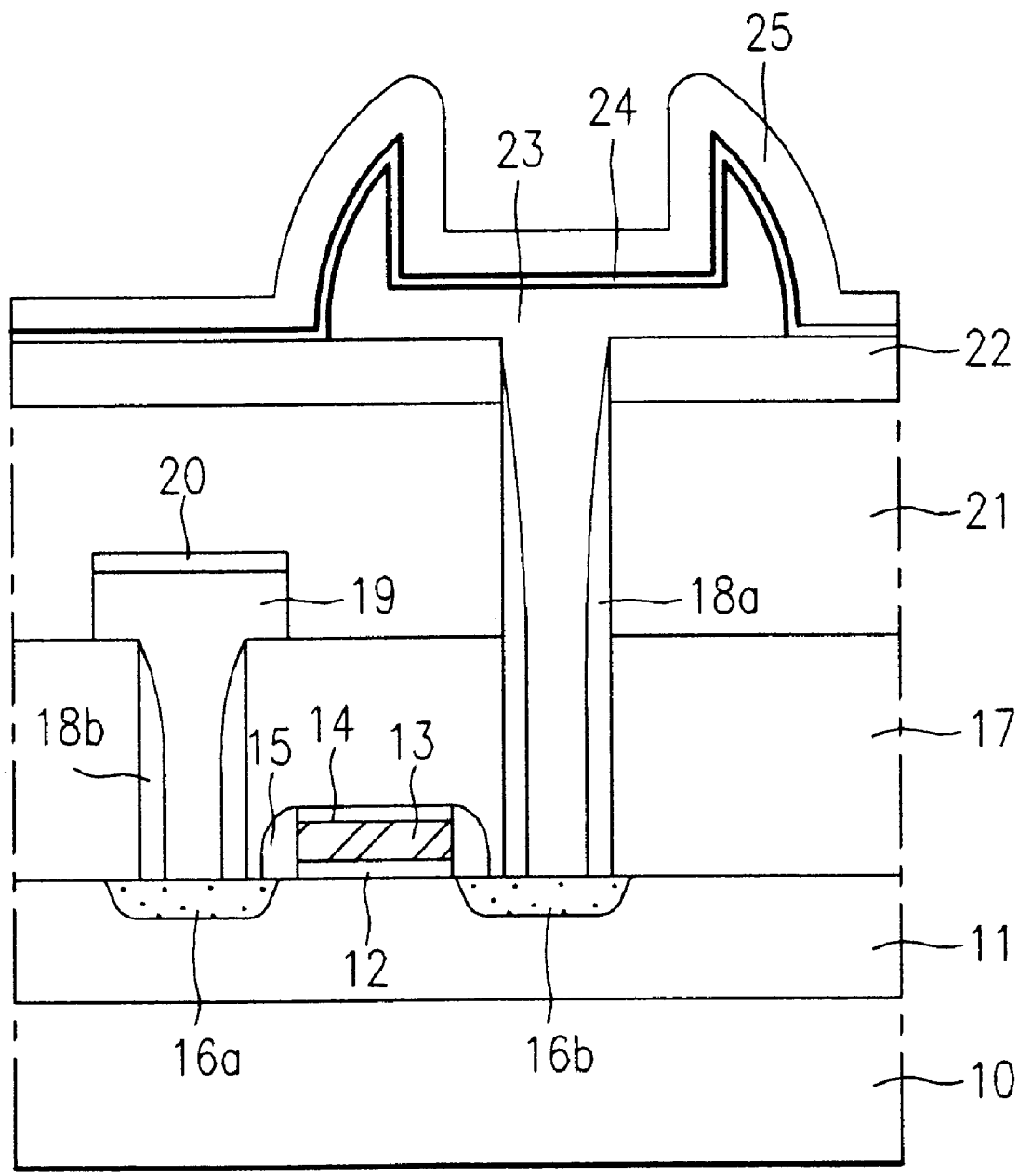
FIG. 1 is a cross-sectional view of a conventional DRAM cell.
Figure 2A:
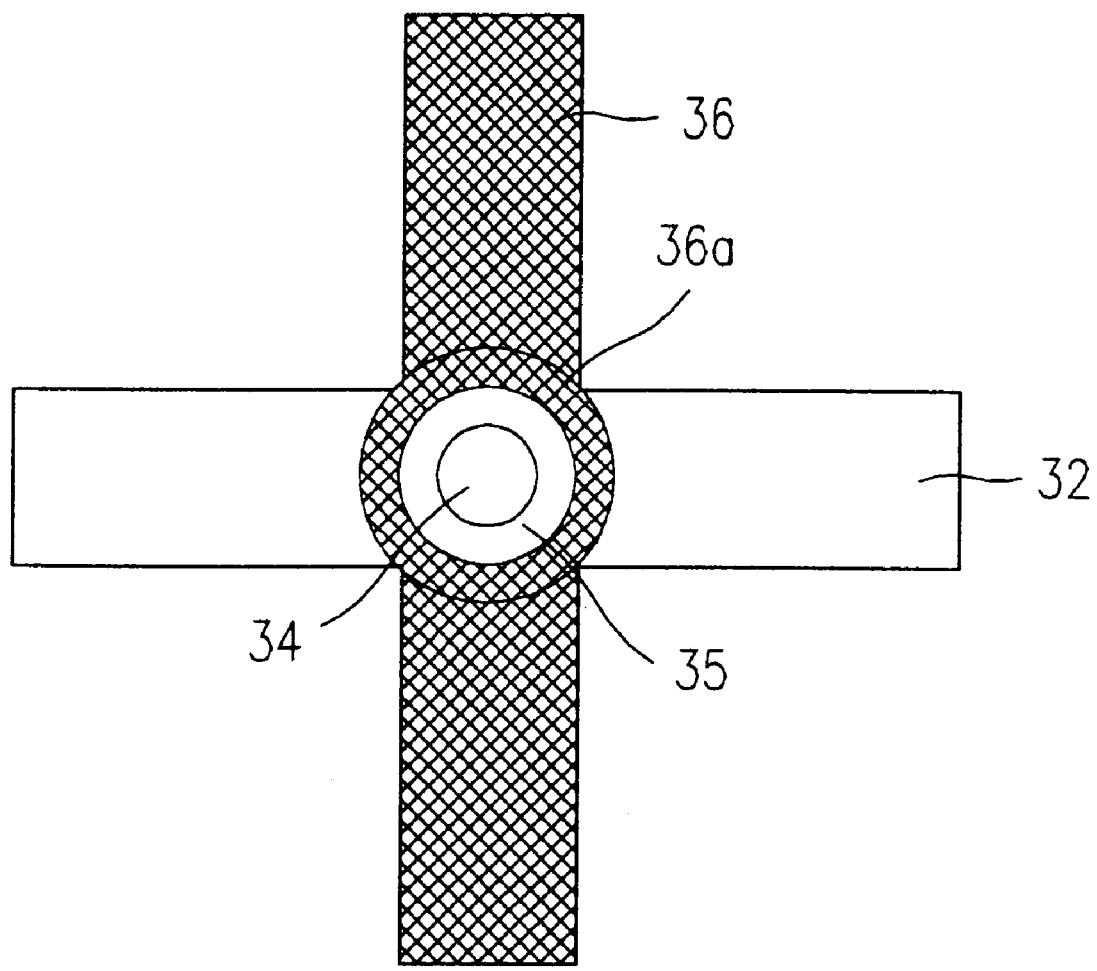
FIGS. 2a and 2b are plan views of a DRAM cell array according to a first embodiment of the present invention.
Figure 2B:
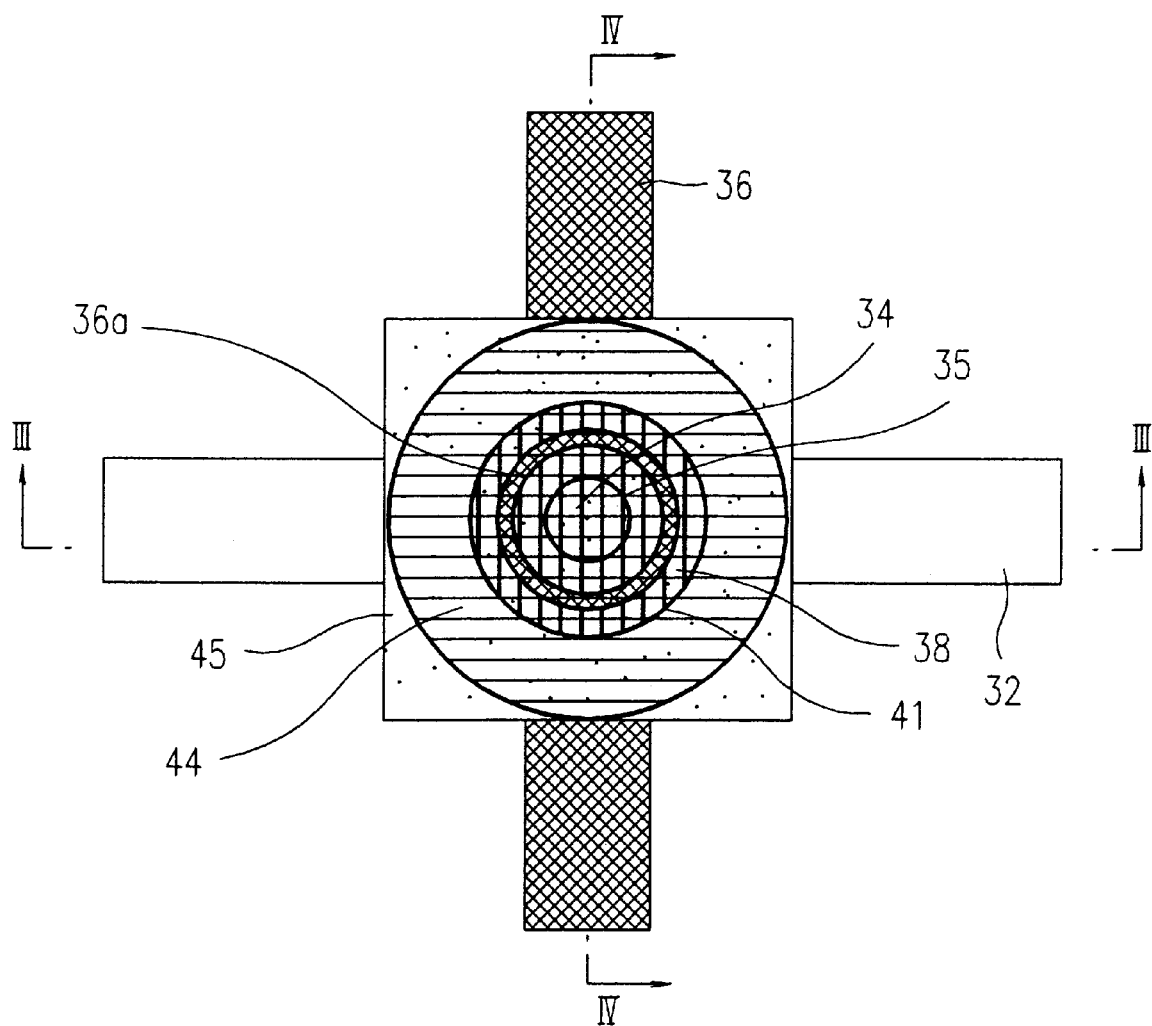

FIGS. 2a and 2b are plan views showing a DRAM cell according to a first embodiment of the present invention. FIG. 2a shows a gate electrode 36a and channel region 34 of the DRAM cell of the present invention. Referring to FIG. 2a, a word line 36 and bit line 32 intersect each other, and a channel region 34 of the DRAM cell is formed at the intersection. A gate oxide layer 35 surrounds channel region 34, and the gate electrode 36a surrounds the channel region 34 and the gate oxide layer 35.

Referring to FIG. 2b, word line 36 and bit line 32 are arranged perpendicular to each other, and gate electrode 36a is formed at the portion where the word line 36 and bit line 32 intersect each other. Gate electrode 36a is formed in the shape of a ring. A first conductive layer 38 surrounds gate electrode 36a, but is separated therefrom by a first insulating layer 37 (see FIG. 3). A first dielectric layer 39 (shown in FIG. 3) surrounds first conductive layer 38, and a second conductive layer 41 surrounds the first dielectric layer 39. Furthermore, a second dielectric layer 43 (shown in FIG. 3) surrounds second conductive layer 41, and a third conductive layer 44 surrounds the second dielectric layer 43. As described above, bit line 32, gate electrode 36a and a capacitor region are sequentially formed. Accordingly, it is possible to realize a high-integrated DRAM easily.

Figure 3:
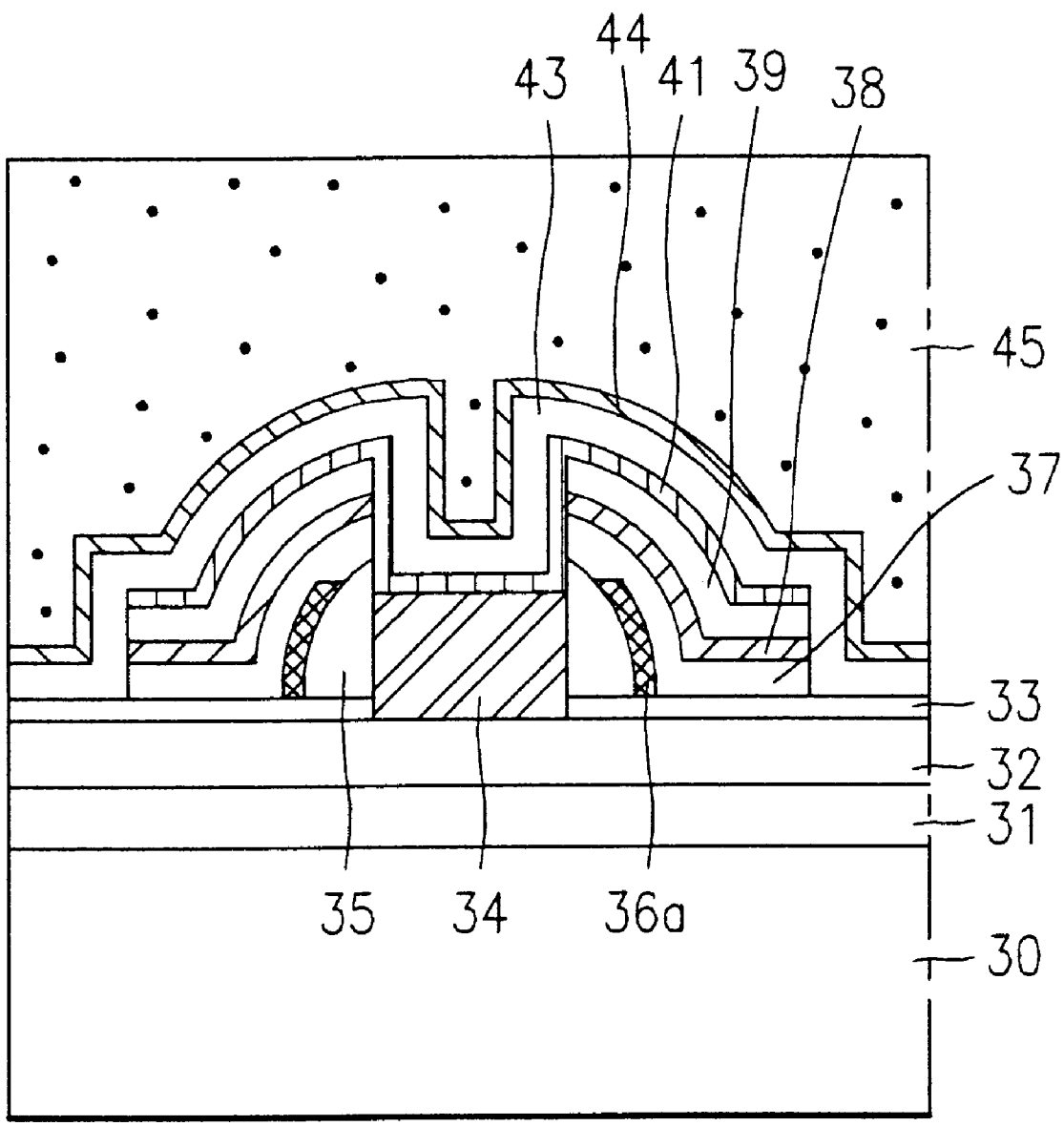
FIG. 3 is a cross-sectional view of the DRAM cell according to the first embodiment of the present invention taken along line III—III of FIG. 2b.
Figure 4:
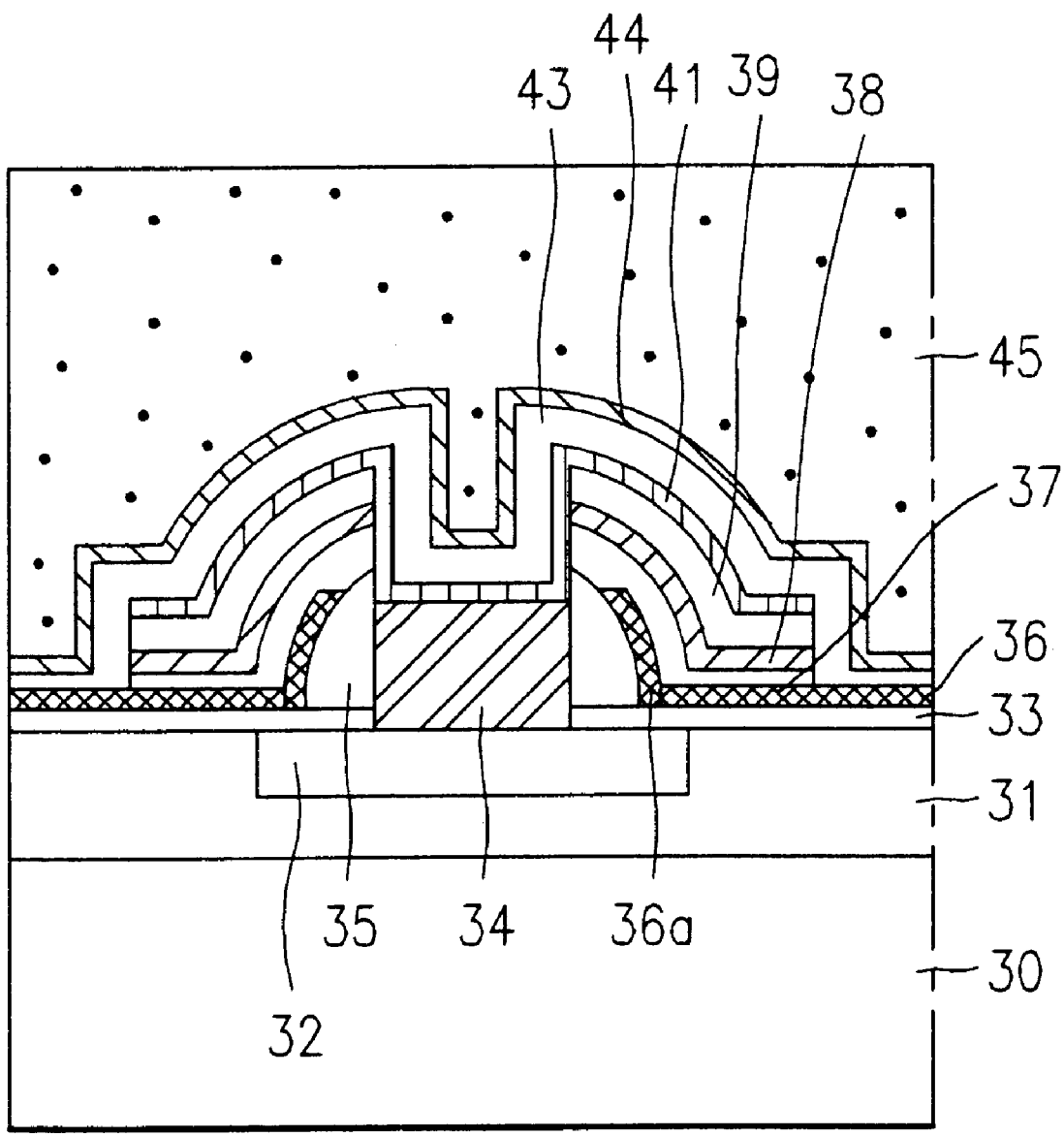
FIG. 4 is a cross-sectional view of the DRAM cell according to the first embodiment of the present invention taken along line IV—IV of FIG. 2b.

The DRAM cell structure according to the first embodiment of the present invention will be explained below with reference to FIGS. 3 and 4. FIG. 3 is a cross-sectional view of the DRAM cell according to the first embodiment of the present invention taken along line III—III of FIG. 2b, and FIG. 4 is a cross-sectional view of the DRAM cell according to the first embodiment of the present invention taken along line IV—IV of FIG. 2b.

The DRAM cell is constructed in such a manner that a p-type semiconductor layer 31 is formed in a predetermined portion of an n-type substrate 30 in order to insulate bit line 32 from substrate 30, and bit line 32 is formed in one direction in p-type semiconductor layer 31. Bit line 32 is formed in such a manner that an n-type impurity is injected into p-type semiconductor layer 31.

Furthermore, a vertical channel region 34 having a cylindrical shape is formed on a predetermined portion of bit line 32, and a first gate oxide layer 33 is formed over the portion of substrate 30 not covered by the channel region 34. A gate oxide layer 35 surrounds channel region 34, and is formed higher than channel region 34. A vertical gate electrode 36a is formed along the sides of gate oxide layer 35. The height of the gate electrode 36a is less than the height of gate oxide layer 35.

A first insulating layer 37 and first conductive layer 38 are sequentially formed to surround gate electrode 36a. A first dielectric layer 39 is formed on first conductive layer 38. Neither the first insulating layer 37, the first conductive layer 38, nor the first dielectric layer 39, however, are formed on the channel region 34. A second conductive layer 41 is then formed over the first dielectric layer 39 and the channel region 34, and thus, comes into contact with channel region 34 to serve as a capacitor storage node surrounding first dielectric layer 39. A second dielectric layer 43 is formed on and surrounds second conductive layer 41. The second dielectric layer 43 is also formed on the first oxide layer 33 and word line 36. A third conductive layer 44, serving as a capacitor plate node, is formed on second dielectric layer 43, and a second insulating layer 45 is formed on the overall surface of third conductive layer 44.

As described above, the capacitor of the DRAM cell is constructed in such a manner that first conductive layer 38 is connected to second conductive layer 41 used as the capacitor storage node. This increases the resulting capacitance. Furthermore, since bit line 32, gate electrode 36a and the capacitor are sequentially laminated and channel region 34 is formed vertically, the integration and operation speed of the DRAM are increased.

Figure 5A:
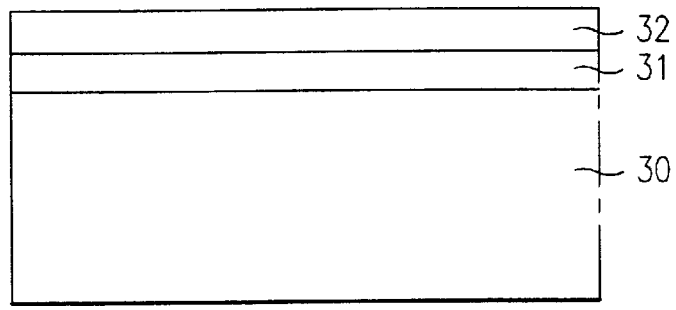
FIGS. 5a to 5j are cross-sectional views corresponding to FIG. 3 showing a process of fabricating the DRAM cell according to the first embodiment of the present invention.

A method of fabricating the DRAM cell according to the first embodiment of the present invention will be explained below with reference to FIGS. 5a to 5j. FIGS. 5a–5j are cross-sectional views corresponding to FIG. 3. Referring to FIG. 5a, a p-type impurity such as boron is ion-implanted into an n-type substrate 30 to a predetermined depth; thereby forming a p-type semiconductor layer 31. Then, an n-type impurity such as phosphorus is ion-implanted in higher concentration into the p-type semiconductor layer 31 to form a bit line 32 in p-type semiconductor layer 31. The bit line 32 serves as the source of the transistor.

Figure 5B:
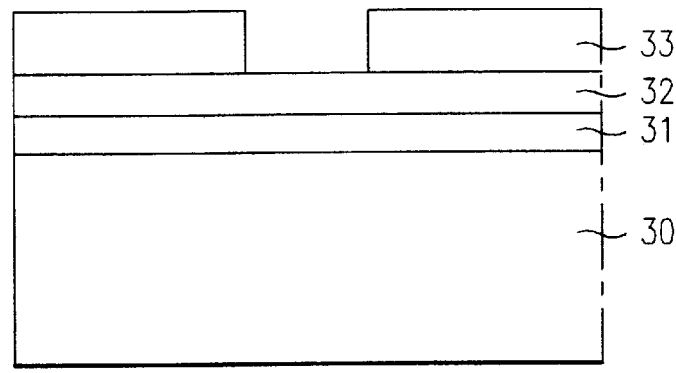
Figure 5C:
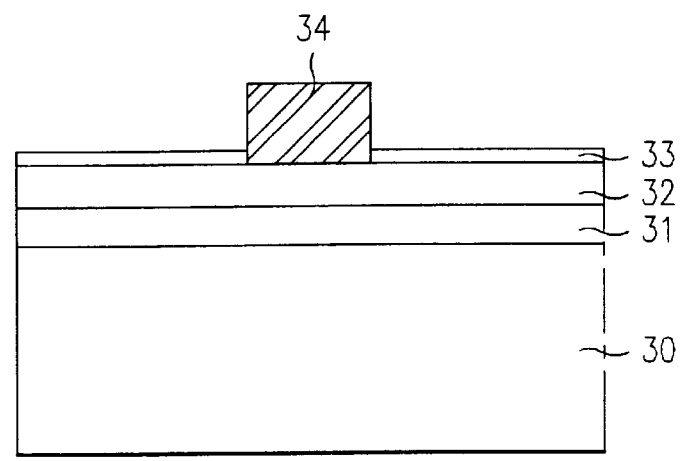

Referring to FIG. 5b, a first oxide layer 33 is formed on the bit line 32, and then a predetermined photoresist pattern (not shown) is formed thereon. First oxide layer 33 is selectively etched, using the photoresist pattern as a mask, to thereby form a hole. Thereafter, the photoresist is removed. Referring to FIG. 5c, a silicon layer is formed in the hole through selective epitaxy to thereby form a channel region 34 having a cylindrical shape in the hole. First oxide layer 33 is then etched through isotropic etching to a predetermined thickness on the bit line 32.

Figure 5D:
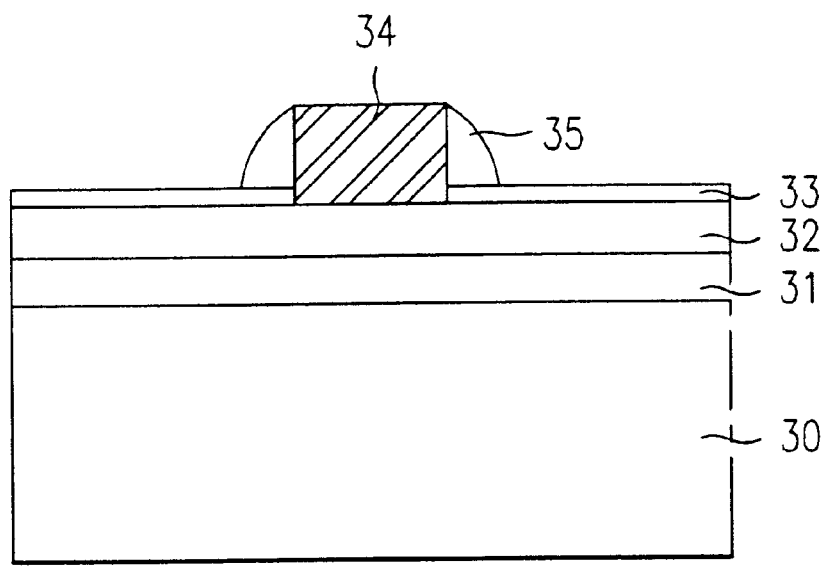
Figure 5E:
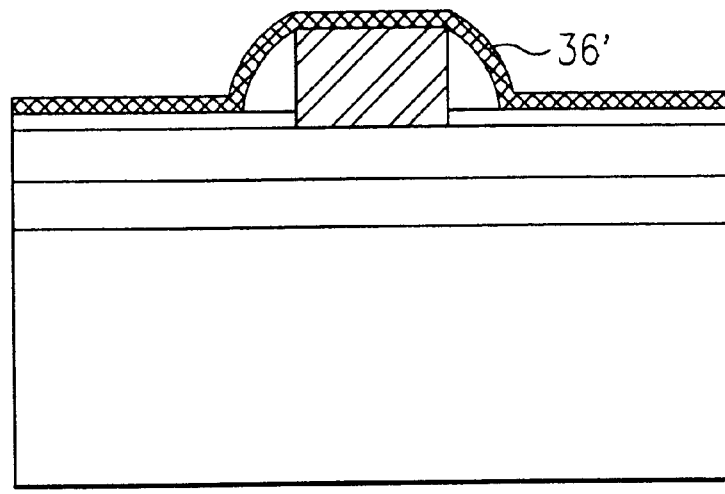
Figure 5F:
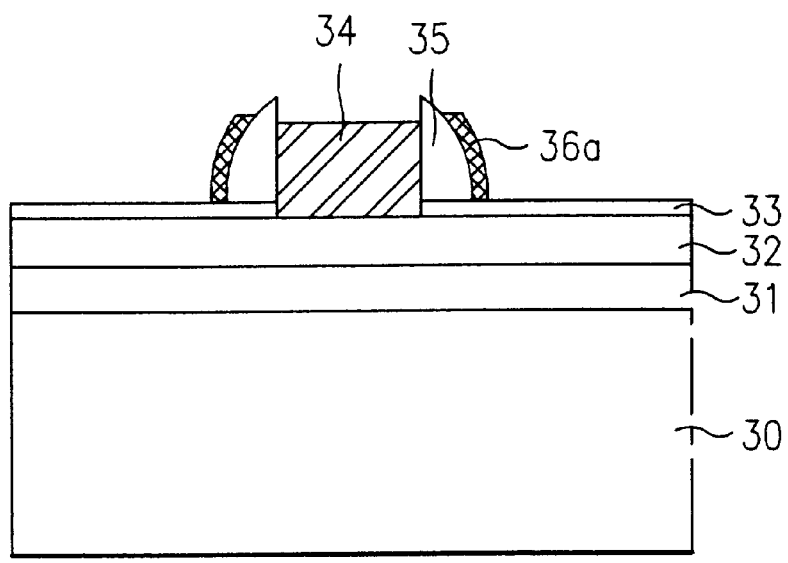

Referring to FIG. 5d, an oxide layer is formed over the overall surface of the substrate 30 and anisotropic-etched to thereby form gate oxide layer 35 on the sides of channel region 34. Referring to FIG. 5e, a polysilicon layer 36' is formed over the overall surface of the substrate 30. The polysilicon layer 36' will be used as word line 36 and gate electrode 36a. Referring to FIG. 5f, the polysilicon layer 36' is anisotropic-etched to surround the side of gate oxide layer 35 thereby forming gate electrode 36a and word line 36. Here, the polysilicon layer 36' is over-etched. By doing so, the resulting height of both channel region 34 and gate electrode 36a is less than the height of gate oxide layer 35.

Figure 5G:
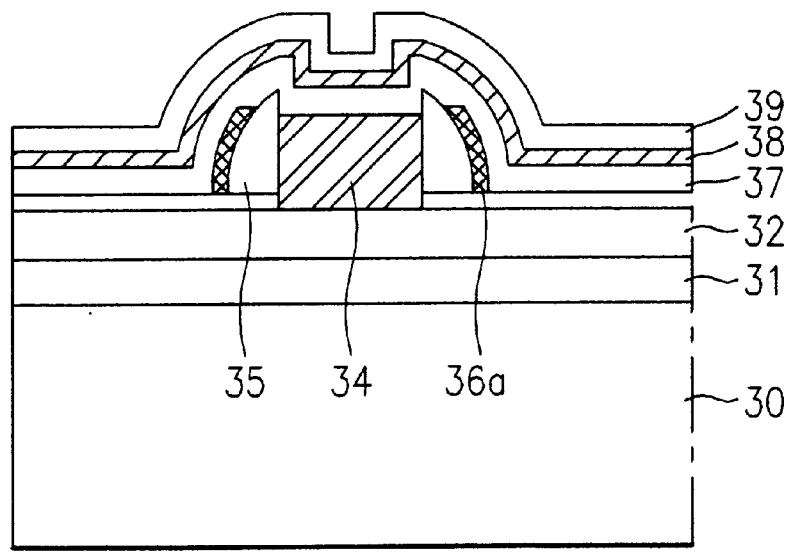
Figure 5H:
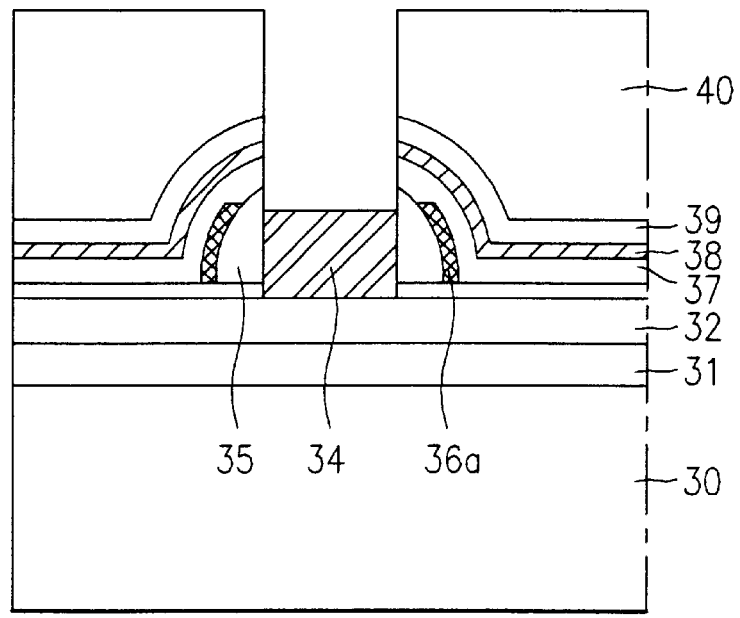

Referring to FIG. 5g, a first insulating layer 37, first conductive layer 38 and first dielectric layer 39 are sequentially formed over the overall surface of the substrate 30. Preferably, the first conductive layer 38 is formed of the same material as the bit line 32. Referring to FIG. 5h, a photoresist layer is formed on first dielectric layer 39, and selectively exposed and developed through photolithography to thereby form a first photoresist pattern 40. Then, a portion of first dielectric layer 39, first conductive layer 38 and first insulating layer 37 over channel region 34 are sequentially etched using first photoresist pattern 40 as a mask. Thereafter, first photoresist pattern 40 is removed.

Figure 5I:
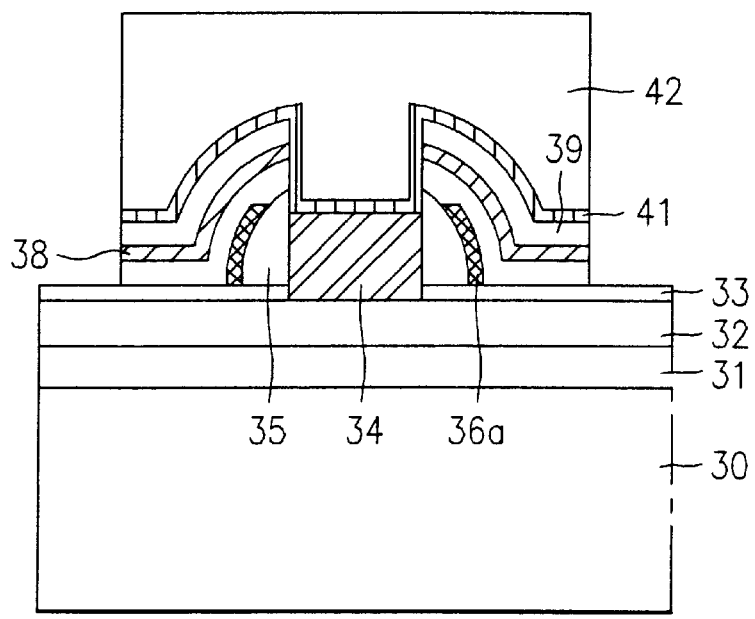

Referring to FIG. 5i, a second conductive layer 41 is formed on the exposed portion of channel region 34 and first dielectric layer 39. Preferably, the second conductive layer 41 is formed of the same material as the bit line 32. Then a second photoresist pattern 42 is formed on a predetermined portion of second conductive layer 41. Second conductive layer 41 forms both the drain of the transistor and the capacitor storage node. Also preferable is forming second conductive layer 41 of a polysilicon layer with an n-type impurity, such as phosphorus, doped thereinto. Thereafter, second conductive layer 41, first dielectric layer 39, first conductive layer 38, and first insulating layer 37 are sequentially etched using second photoresist pattern 42 as a mask.

Figure 5J:
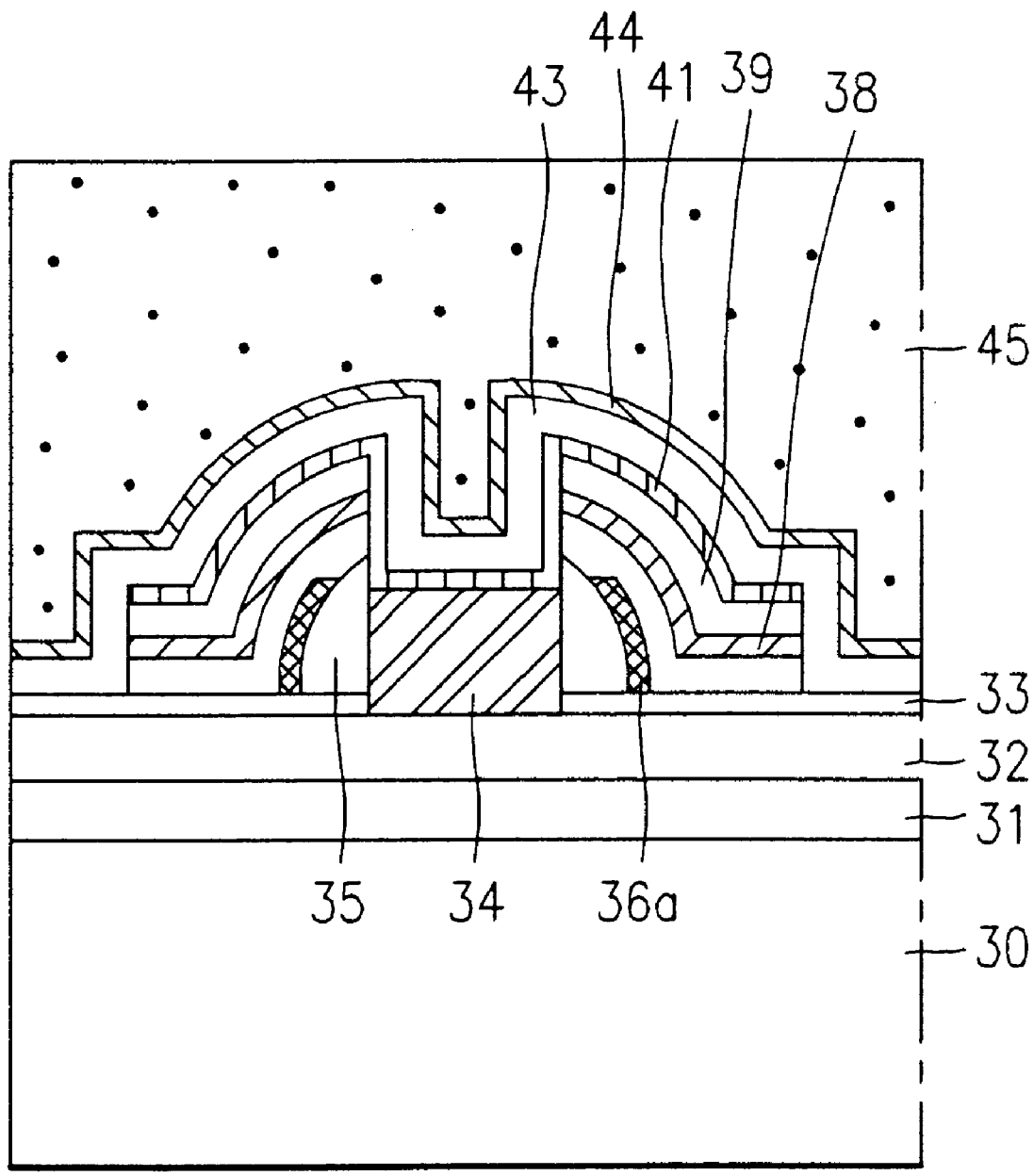

Referring to FIG. 5j, after removing second photoresist pattern 42, a second dielectric layer 43 and third conductive layer 44, forming a capacitor plate node, are sequentially formed over a portion of the overall surface of the substrate 30. Preferably, the third conductive layer is formed of the same material as the channel region 34. A second insulating layer 45 is then formed thereon to complete formation of the DRAM cell.

Figure 6:
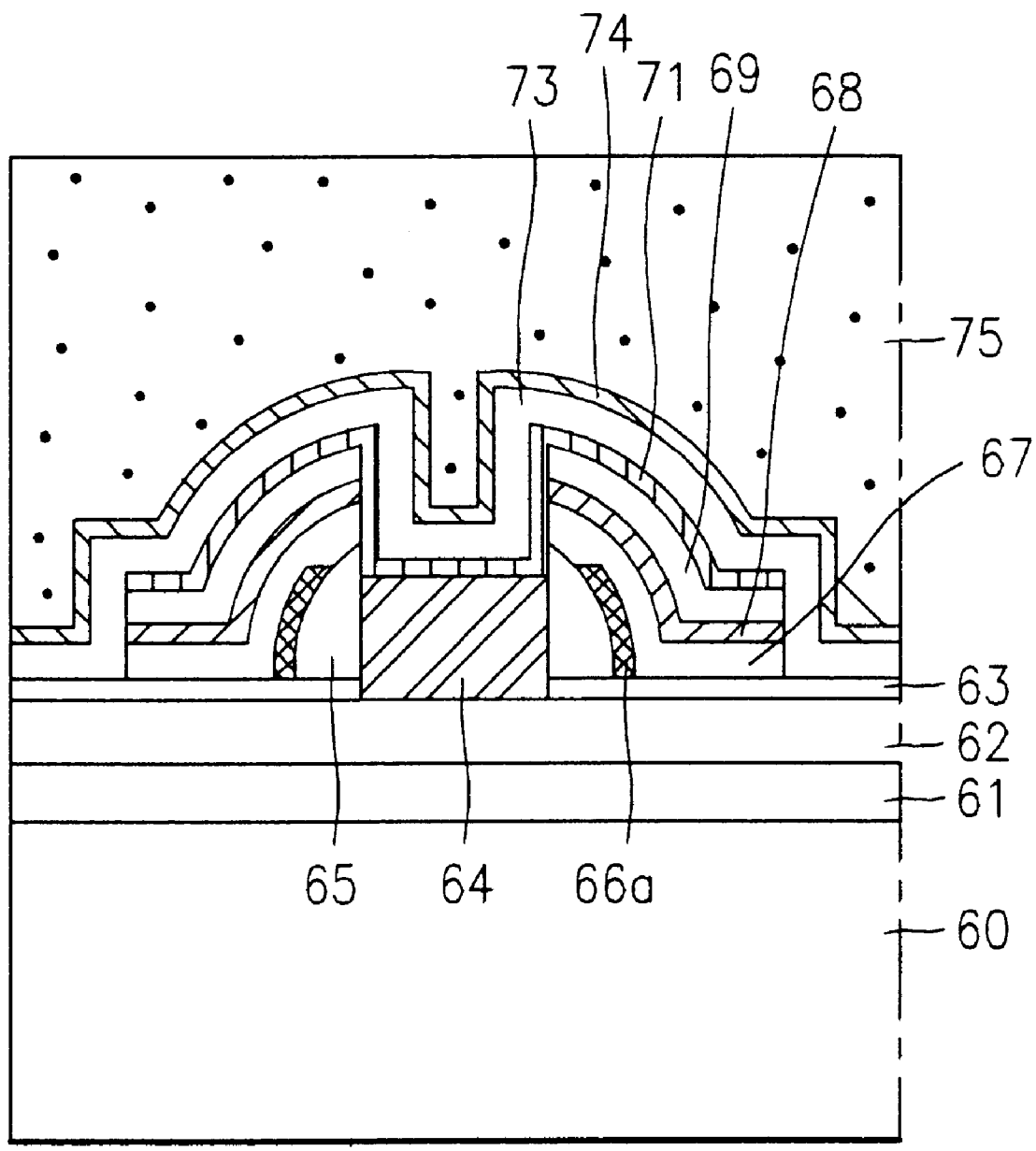
FIG. 6 is a cross-sectional view corresponding to FIG. 3 of a DRAM cell according to a second embodiment of the present invention.
Figure 7:
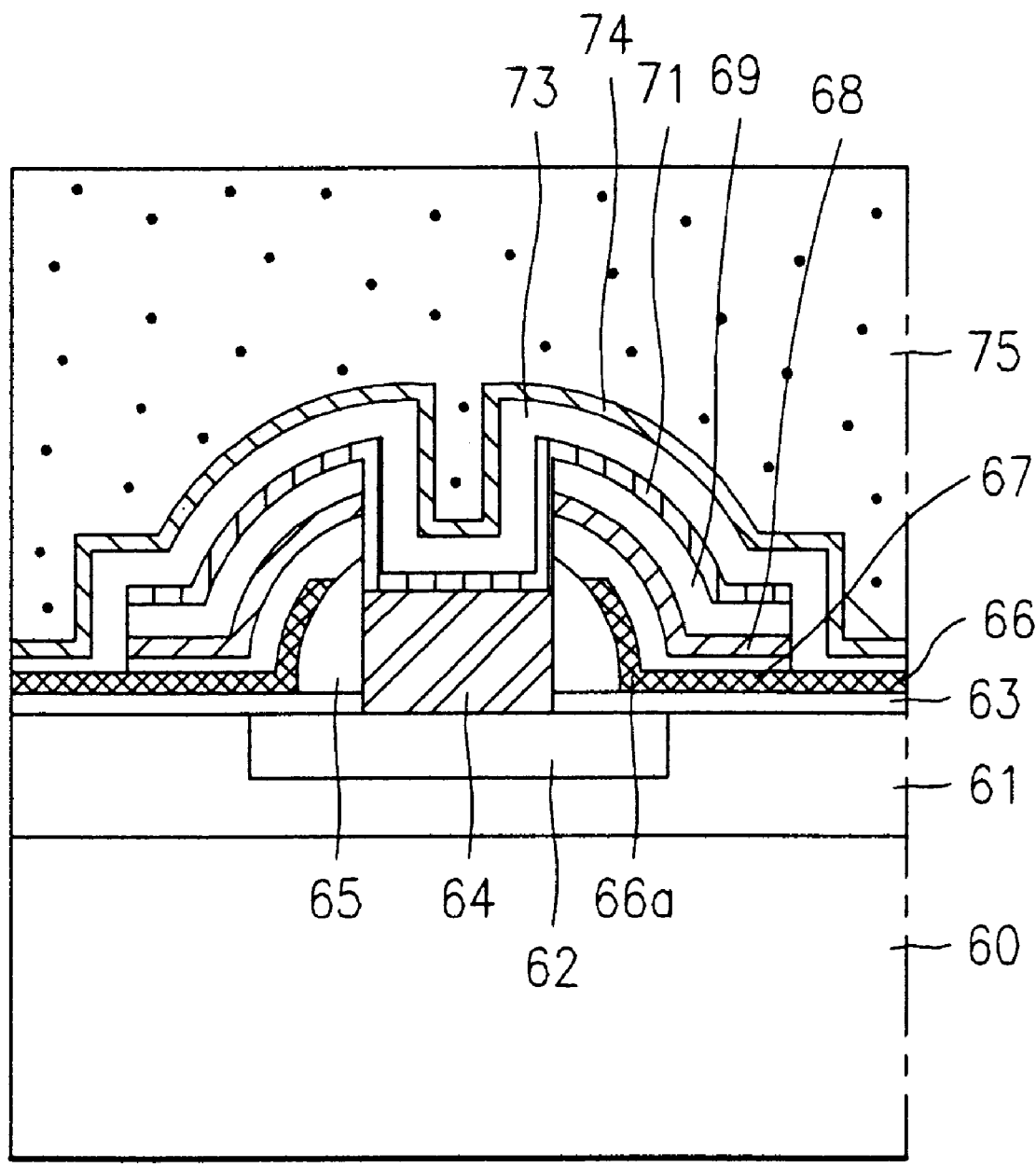
FIG. 7 is a cross-sectional view corresponding to FIG. 4 of the DRAM cell according to the second embodiment of the present invention.

The DRAM cell according to the second embodiment of the present invention will be explained below with reference to FIGS. 6 and 7. FIGS. 6 and 7 show cross-sectional views corresponding to FIGS. 3 and 4, respectively. The DRAM cell of the second embodiment is constructed in such a manner that an insulating oxide layer 61 is formed on an insulating substrate 60, and a silicon layer 62 is formed in one direction on oxide layer 61; thereby forming a silicon on insulator (SOI) structure. A vertical channel region 64 having a cylindrical shape is formed on a predetermined portion of the SOI, and a first oxide layer 63 is formed over the portion of substrate 60 not covered by the channel region 64. A gate oxide layer 65 surrounds channel region 64, and is formed higher than channel region 64.

A vertical gate electrode 66a surrounds gate oxide layer 65. Gate electrode 66a has a height less than the height of gate oxide layer 65. A word line 66 is formed on first oxide layer 63, and is connected to gate electrode 66a. A first insulating layer 67 is formed to surround gate electrode 66a. A first conductive layer 68 surrounds first insulating layer 67, and a first dielectric layer 69 surrounds first conductive layer 68. A second conductive layer 71 surrounds first dielectric layer 69 and is formed on the channel region 64. A second dielectric layer 73 is formed on second conductive layer 71, first oxide layer 63 and word line 66; third conductive layer 74 is formed on second dielectric layer 73; and a second insulating layer 75 is formed on third conductive layer 74.

Figure 8A:
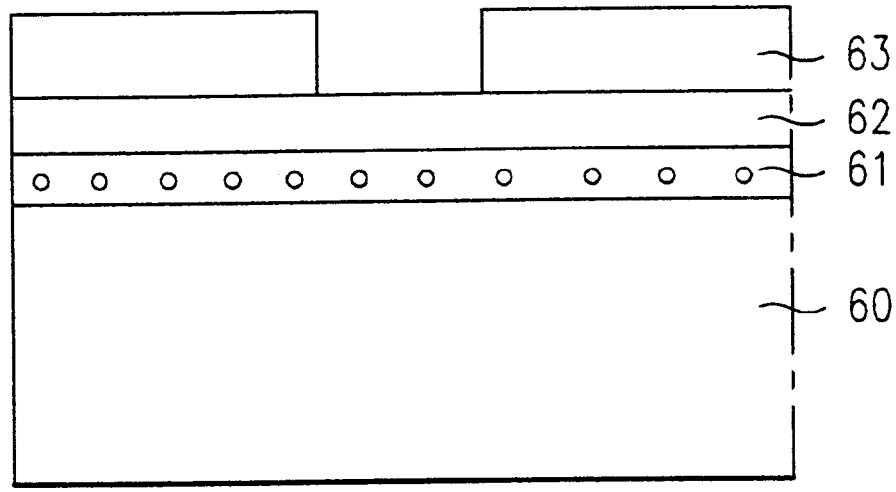
FIGS. 8a to 8i are cross-sectional views corresponding to FIG. 6 showing a process of fabricating the DRAM cell according to the second embodiment of the present invention.

A method of fabricating the DRAM cell according to the second embodiment of the present invention will be explained below with reference to FIGS. 8a to 8i. FIGS. 8a–8i show cross-sectional views corresponding to FIG. 6. Referring to FIG. 8a, a first oxide layer 63 is formed on a semiconductor layer 62 of a silicon on insulator (SOI) structure. The SOI structure is formed of insulating substrate 60, insulating oxide layer 61 and silicon layer 62. Here, silicon layer 62 is used as a bit line. A predetermined photoresist pattern (not shown) is formed on first oxide layer 63. First oxide layer 63 is selectively etched using the photoresist pattern as a mask to thereby form a hole. Thereafter, the photoresist is removed.

Figure 8B:
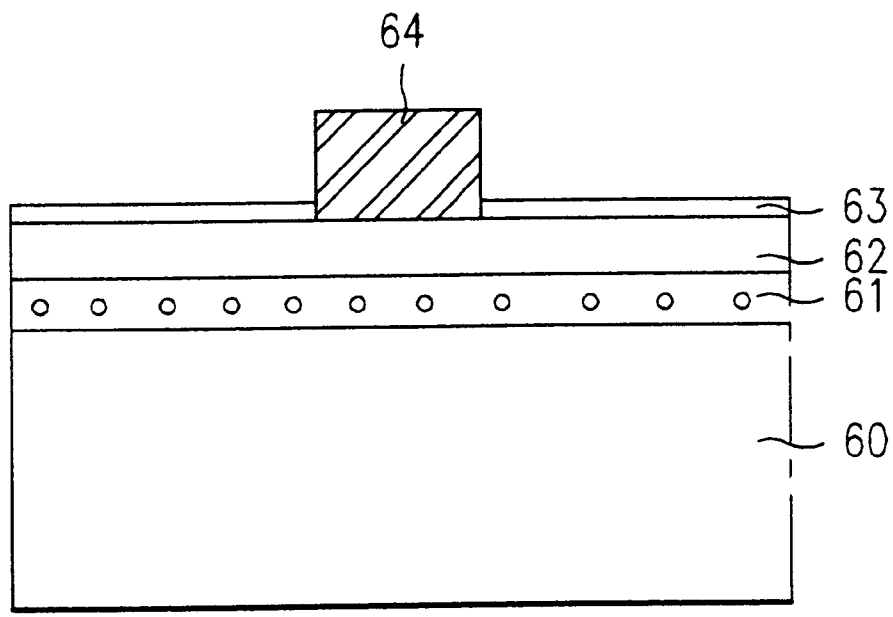

Referring to FIG. 8b, a silicon layer is formed in the hole through selective epitaxy to form a channel region 64 having a cylindrical shape in the hole. First oxide layer 63 is then etched through isotropic etching to a predetermined thickness.

Figure 8C:
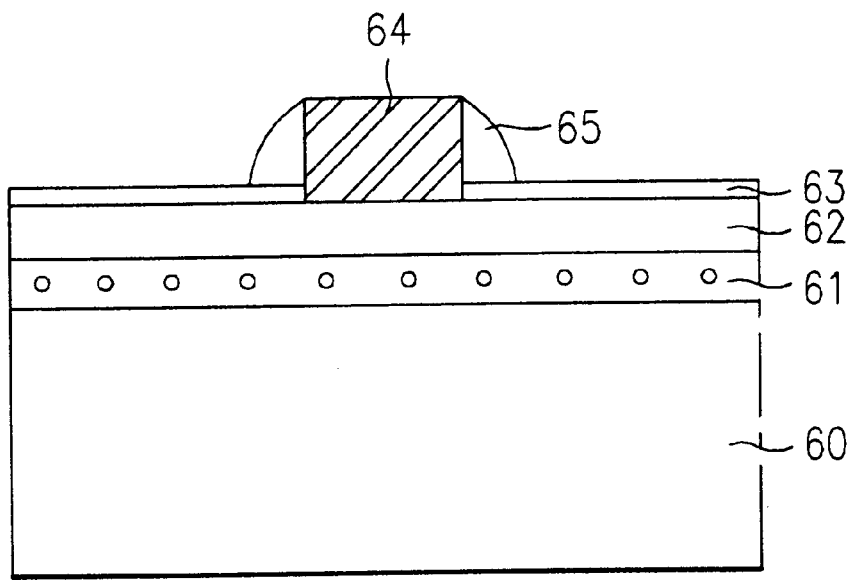
Figure 8D:
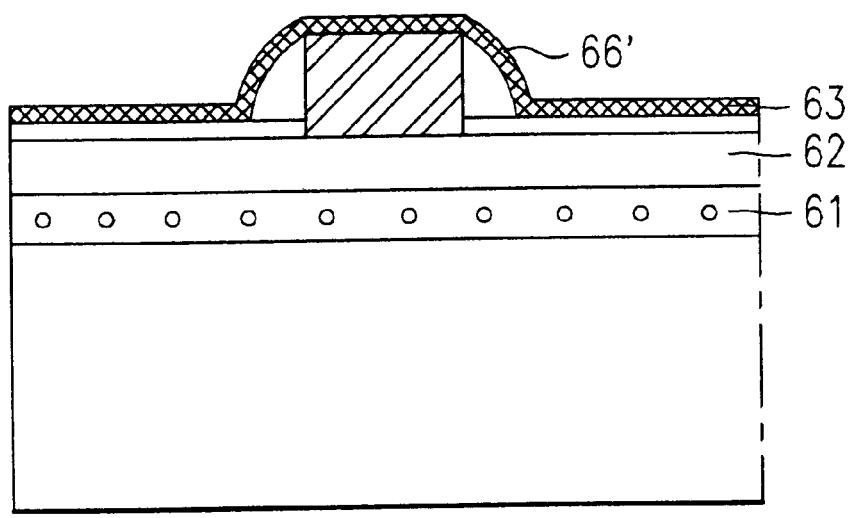
Figure 8E:
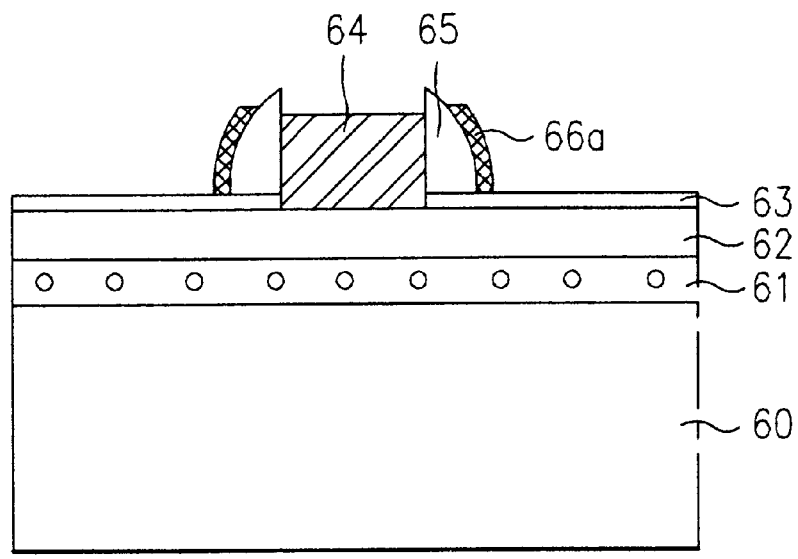

Referring to FIG. 8c, an oxide layer is formed on the overall surface of the substrate and anisotropic-etched to thereby form a gate oxide layer 65 surrounding channel region 64. Referring to FIG. 8d, a polysilicon layer 66' is formed over the overall surface of the substrate 60. The polysilicon layer 66' will be used as word line 66 and gate electrode 66a. Referring to FIG. 8e, the polysilicon layer 66' is anisotropic-etched to surround the sides of gate oxide layer 65; thereby forming the gate electrode 66a and word line 66. Here, the polysilicon layer 66' is over-etched. By doing so, the resulting height of both channel region 64 and gate electrode 66a is less than the height of gate oxide layer 65.

Figure 8F:
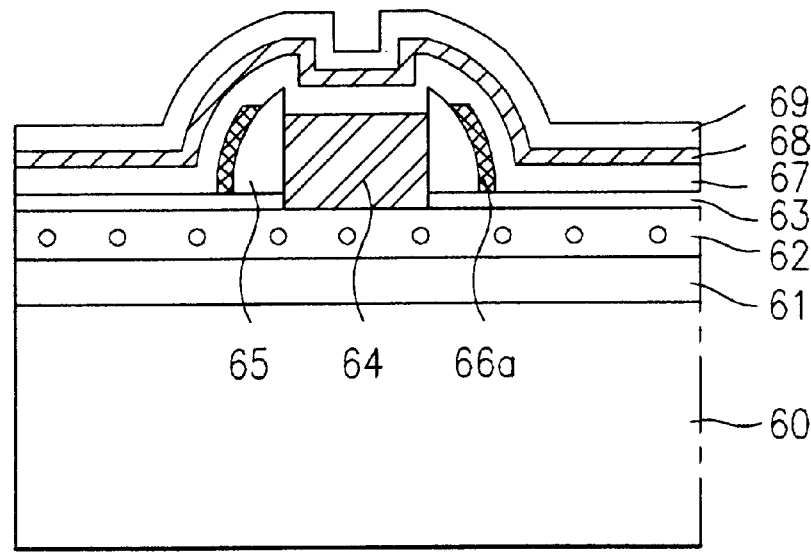
Figure 8G:
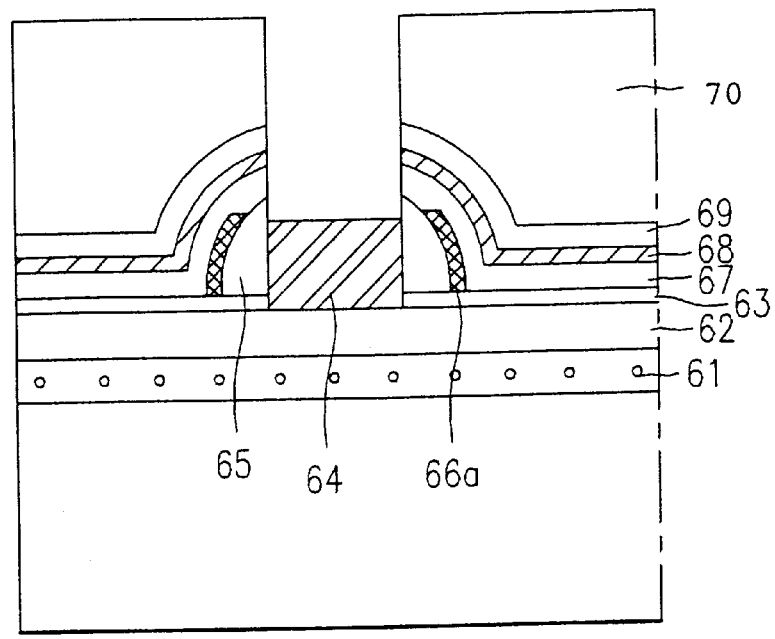

Referring to FIG. 8f, a first insulating layer 67, first conductive layer 68 and first dielectric layer 69 are sequentially formed over the overall surface of the substrate 60. Preferably, the first conductive layer 68 is formed of the same material as bit line 62. Referring to FIG. 8g, a photoresist layer is formed on first dielectric layer 69, and selectively exposed and developed through photolithography to thereby form a first photoresist pattern 70. Then, a portion of first dielectric layer 69, first conductive layer 68 and first insulating layer 67 over channel region 64 are sequentially etched using first photoresist pattern 70 as a mask.

Figure 8H:
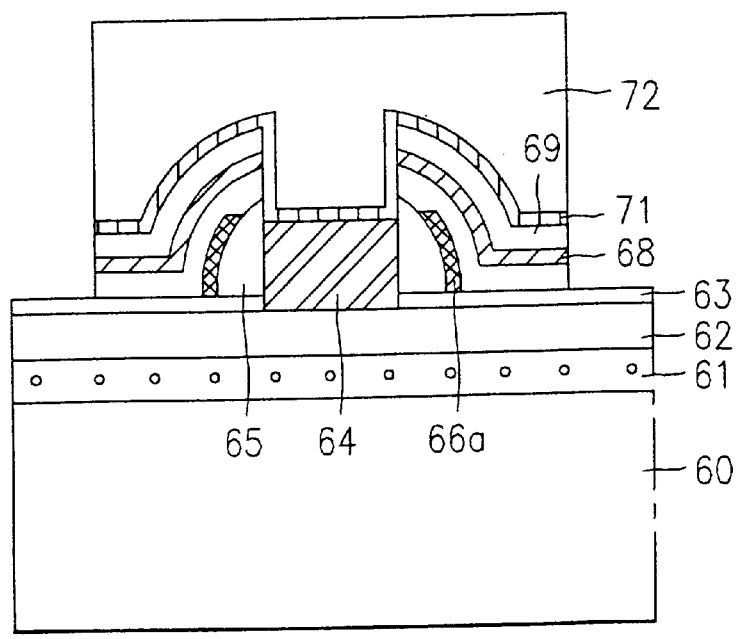

Referring to FIG. 8h, after removing first photoresist pattern 70, a second conductive layer 71 is formed on the exposed portion of channel region 64 and first dielectric layer 69. Then a second photoresist pattern 72 is formed on a predetermined portion of second conductive layer 71. Second conductive layer 71 forms both the drain of the transistor and the capacitor storage node. Preferably, second conductive layer 71 is formed of the same silicon material forming the bit line 62.

Figure 8I:
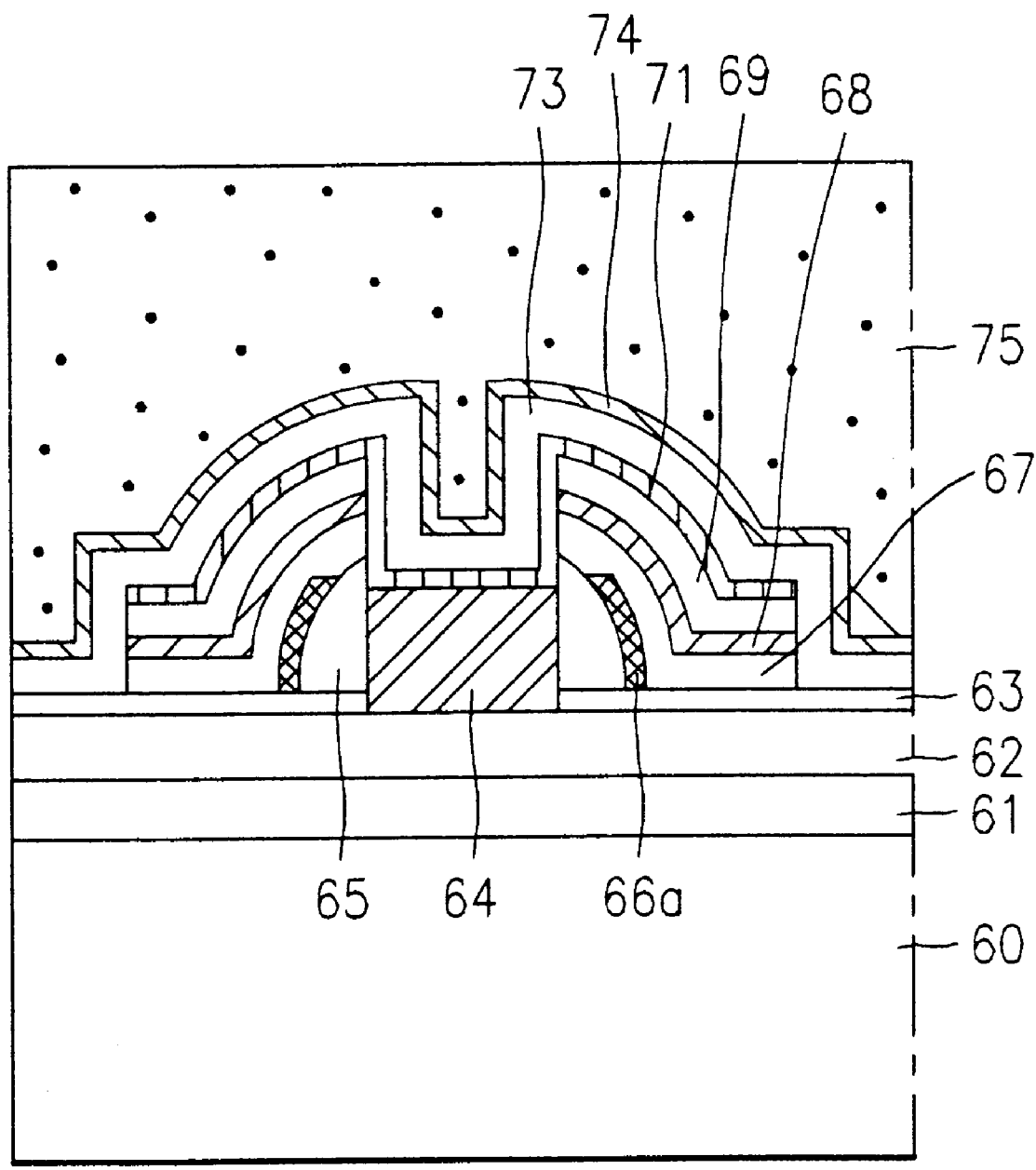

Thereafter, second conductive layer 71, first dielectric layer 69, first conductive layer 68, and first insulating layer 67 are sequentially etched using second photoresist pattern 72 as a mask. Then, second photoresist pattern 72 is removed. Referring to FIG. 8i, a second dielectric layer 73, and third conductive layer 74, forming a capacitor plate node, are sequentially formed over a portion of the overall surface of the substrate 60, and a second insulating layer 75 is formed on the third conductive layer 74 to complete the formation of the DRAM cell. Preferably, the third conductive layer 74 is formed of the same material as the channel region 64.

When the aforementioned SOI structure is used, silicon layer 62, forming the source and bit line, is securely isolated from substrate 60 by oxide layer 61, thereby improving the performance of the DRAM.

The present invention has the following advantages. First, since the bit line, gate electrode and capacitor are sequentially formed, a highly integrated device can be obtained. Secondly, the channel region has a cylindrical structure so that its area is enlarged, increasing the operation speed of the device. Thirdly, the capacitor fabrication process is simplified, and well formation, isolation, ion implantation, heat treatment and diffusion processes can be omitted. Accordingly, the number of fabrication steps is reduced, and thus productivity is increased. This results in a lower device price.

It will be apparent to those skilled in the art that various modifications and variations can be made in the DRAM cell and method of fabricating the same of the present invention without departing from the spirit or scope of the invention. Thus, it is intended that the present invention cover the modifications and variations of this invention.

What is claimed is:

1. A method of fabricating a DRAM cell, comprising:
   (a) providing a substrate;
   (b) forming a bit line in a first direction on said substrate;
   (c) forming a channel region on a portion of said bit line, said channel region having a lateral surface extending vertically from said bit line;
   (d) forming a first insulating layer over said substrate, excluding said channel region, and on at least a portion of said lateral surface of said channel region;
   (e) forming a first conductive layer in a second direction on said first insulating layer to serve as a word line, and on a portion of said first insulating layer, which is on said portion of said lateral surface of said channel region, to serve as a gate electrode;
   (f) forming a second insulating layer over a portion of said substrate such that said second insulating layer covers said channel region;
   (g) forming a contact hole in said second insulating layer which exposes said channel region; and
   (h) forming a capacitor on a portion of said second insulating layer and on said channel region via said contact hole.

2. The method of claim 1, wherein said first direction and said second direction are perpendicular.

3. The method of claim 1, wherein said step (d) forms said first insulating layer on and surrounding said lateral surface of said channel region.

4. The method of claim 3, wherein said step (e) forms said first conductive layer such that said gate electrode surrounds said first insulating layer formed on and surrounding said lateral surface of said channel region.

5. The method of claim 1, wherein said step (c) forms said channel region having a vertical cylindrical shape.

6. The method of claim 1, wherein said channel region has a first height, said first insulating layer formed on said portion of said lateral surface of said channel region has a second height, said gate electrode has a third height, and said second height is greater than both said first and third heights.

7. The method of claim 1, wherein said step (h) comprises:
   (h1) forming a storage electrode on said portion of said second insulating layer and electrically connected to said channel region via said first contact hole;
   (h2) forming a first dielectric layer on said storage electrode; and
   (h3) forming a plate electrode on said first dielectric layer.

8. The method of claim 7, wherein said step (h1) comprises:
   (h11) forming a second conductive layer on said portion of said second insulating layer;
   (h12) forming a second dielectric layer on said second conductive layer; and
   (h13) forming a third conductive layer on said second dielectric layer and on said channel region via said first contact hole.

9. The method of claim 8, wherein
   said step (a) includes the steps of (a1) providing a base substrate of a first conductivity type, and (a2) forming a semiconductor layer of a second conductivity type on said base substrate; and
   said step (b) forms an impurity region of said first conductivity type in said semiconductor layer to form said bit line.

10. The method of claim 9, wherein
    said step (h11) forms said second conductive layer from the same material as said bit line; and
    said step (h13) forms said third conductive layer from the same material as said bit line.

11. The method of claim 7, wherein said step (h3) forms said plate electrode from the same material used to from said channel region.

12. The method of claim 1, wherein
    said step (a) includes the steps of (a1) providing a base substrate of a first conductivity type, and (a2) forming a semiconductor layer of a second conductivity type on said base substrate; and
    said step (b) forms an impurity region of said first conductivity type in said semiconductor layer to form said bit line.

13. The method of claim 1, wherein
    said step (a) includes the steps of (a1) providing an insulating base substrate, and (a2) forming an insulating oxide layer on said insulating base substrate; and
    said step (b) forms a silicon layer in said insulating oxide layer to form said bit line.

14. The method of claim 1, wherein said step (c) forms said channel region through selective epitaxy.

15. The method of claim 1, wherein said step (h) forms said capacitor to have, when viewed vertically, a circular shape centered on said channel region.

* * * * *